US006702480B1

(12) United States Patent  
Sparacino (10) Patent No.: US 6,702,480 B1
(45) Date of Patent: Mar. 9, 2004

(54) OPTO-ELECTRONIC CHIP PACKAGE (75) Inventor: John Sparacino, Medford, NJ (US)

(73) Assignee: Aralight, Inc., Jamesburg, NJ (US)

( * ) Notice: Subject to any disclaimer, the term of this patent is extended or adjusted under 35 U.S.C. 154(b) by 33 days.

(21) Appl. No.: 09/872,903

(22) Filed: Jun. 2, 2001

(51) Int. Cl.[7] .................................................. G02B 6/36

(52) U.S. Cl. ........................................ 385/88; 385/92

(58) Field of Search .............................. 385/39, 49, 50, 385/52, 88, 89, 90, 91, 92

(56) References Cited

U.S. PATENT DOCUMENTS 5,625,734 A * 4/1997 Thomas et al. ............... 385/88
6,318,909 B1 * 11/2001 Giboney et al. .............. 385/90
6,390,690 B1 * 5/2002 Meis et al. ................... 385/88

* cited by examiner

*Primary Examiner*—David V. Bruce
*Assistant Examiner*—Therese Barber
(74) *Attorney, Agent, or Firm*—DeMont & Breyer, LLC (57) ABSTRACT

An opto-electronic chip package having a rigid L-shaped chassis to which a flexible circuit board is attached. A first region of the flexible circuit board receives an opto-electronic chip. An optical fiber sub-assembly places at least one optical fiber in optical communication with at least one surface normal opto-electronic device on the opto-electronic chip. The opto-electronic chip package further includes a housing that receives the chassis, the circuit board and the optical fiber sub-assembly. Before placing the chassis, circuit board and optical fiber sub-assembly in the housing, a second region of the circuit board is attached to the chassis. As the chassis and circuit board are placed in the housing, the first region of the circuit board engages a lip of the housing. The lip forces the first region of the circuit board against the chassis such that the first region is perpendicular to the second region of the circuit board. The housing is open at an end to allow a heat sink to be attached to the first end of the circuit board. The same fasteners that are used to attach the heat sink to the circuit board also advantageously attach the circuit board to the chassis, minimizing screw count in the circuit board.

12 Claims, 8 Drawing Sheets

OPTO-ELECTRONIC CHIP PACKAGE

FIELD OF THE INVENTION

The present invention relates to the packaging of opto-electronic chips, and more particularly to the packaging of an opto-electronic chip containing surface normal opto-electronic devices.

BACKGROUND OF THE INVENTION

In an opto-electronic chip package, an opto-electronic chip is attached to a second level electronics package (e.g., a circuit board, etc.). The opto-electronic chip consists of one or more opto-electronic devices (e.g., photodetectors, quantum well modulators, semiconductor lasers, etc.) that are typically mounted on a semiconductor chip. The opto-electronic package further includes an optical fiber sub-assembly that receives one or more optical fibers and fixes them in a specific angular and positional orientation for optical communication with the opto-electronic device(s).

Often, the opto-electronic devices on the opto-electronic chip are surface normal opto-electronic devices. Such devices emit or receive an optical signal along an optical axis that is perpendicular to the top (or bottom) surface of the device. One common example of a surface normal device is a vertical cavity surface emitting laser.

Figure 1:
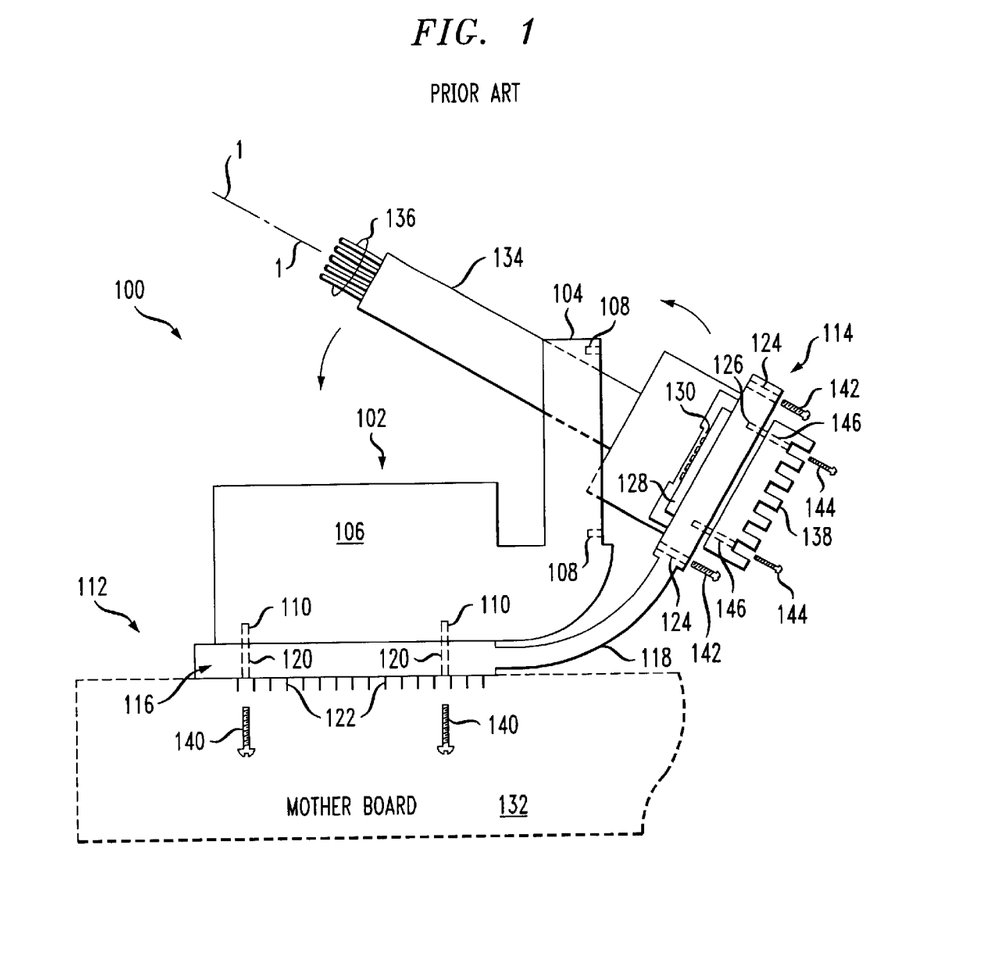
FIG. 1 depicts an opto-electronic chip package in the prior art.

FIG. 1 depicts surface normal opto-electronic chip package 100, which includes chassis 102, circuit board 112, opto-electronic chip 128, optical fiber sub-assembly 134 and heat sink 138, interconnected as shown.

Chassis 102 includes first portion 104 and second portion 106 that are perpendicular to one another. Circuit board 112 includes chip-receiving region 114 and motherboard-interfacing region 116 that are separated by flexible region 118. Chip-receiving region 114 receives opto-electronic chip 128 and motherboard-interfacing region 116 includes electrical connections 122 to motherboard 132. Opto-electronic chip 128 includes surface normal opto-electronic devices 130 and optical fiber sub-assembly 134 includes optical fibers 136.

Optical axis 1—1 of optical fiber sub-assembly 134 (and optical fibers 136) is substantially perpendicular to the emitting/receiving surface of the surface normal opto-electronic devices 130 on chip 128. Also, it is desirable for axis 1—1 of optical fiber sub-assembly 132 to be substantially parallel to motherboard 132 (shown in phantom) upon which package 100 is mounted. (In FIG. 1, axis 1—1 is not parallel to motherboard 132 because, for clarity, chip receiving portion 114 of circuit board 112 is not depicted in its final position against first portion 104 of chassis 102.)

To obtain these positional relationships, flexible circuit board 104 is advantageously used. Its use allows placing chip-receiving region 114 in perpendicular relation to motherboard-interfacing region 116. This is accomplished by flexing flexible region 118 that is disposed between chip-receiving region 114 and motherboard-interfacing region 116 of circuit board 104.

To maintain this perpendicular relationship, chip-receiving region 114 and motherboard-interfacing region 116 of flexible circuit board 104 are typically attached to rigid "L-shaped" chassis 102. Usually, fasteners 140 (e.g., machine screws, etc.) are used to attach motherboard-interfacing region 116 to second portion 106 of chassis 102. Fasteners 140 are received by threaded openings 120 (in motherboard-interfacing region 116) and threaded openings 110 (in portion 106 of chassis 102). Fasteners 142 are used to attach chip-receiving region 114 to first region 104 of chassis 102. Fasteners 142 are received by threaded openings 124 (in chip-receiving region 114) and threaded openings 108 (in portion 104 of chassis 102).

Additionally, heat sink 138 must be attached to chip-receiving region 114 of circuit board 112 to withdraw heat that is generated by attached opto-electronic chip 128. Fasteners 144 can be used for this purpose. Fasteners 144 are received by threaded openings 146 (in heat sink 110) and threaded openings 126 (in chip-receiving region 114).

As a consequence of attaching the circuit board 112 to chassis 102, and heat sink 138 to the circuit board, chip-receiving region 114 has a disadvantageously high fastener count. A high fastener count can lead to low reliability and, further, requires area to be dedicated to the fasteners that could otherwise be used for electronic circuitry, etc.

Accordingly, there is a need for an improved opto-electronic chip package that avoids disadvantages of the prior art.

SUMMARY OF THE INVENTION

The aforedescribed need is met by a chip package in accordance with the present invention. A chip package in accordance with the illustrative embodiment of the invention comprises a rigid L-shaped chassis to which a flexible circuit board is attached. The flexible circuit board includes a chip-receiving region, which receives an opto-electronic chip having surface normal opto-electronic devices disposed thereon. The flexible circuit board also has a motherboard-interface region that provides electrical connection to a motherboard. A flexible region is disposed between the chip-receiving region and the motherboard-interfacing region. When in position against the chassis, the chip-receiving region and the motherboard-interfacing region are perpendicular to one another.

An optical fiber sub-assembly places a plurality of optical fibers in optical communication with the surface normal opto-electronic devices. An optical axis of the optical fiber sub-assembly is perpendicular to an emitting/receiving surface of the surface normal opto-electronic devices. The optical axis of the optical fiber sub-assembly is parallel to the motherboard-interface region of the circuit board.

The chip package further includes a housing that receives the chassis, the circuit board and the optical fiber sub-assembly. Before placing the chassis, circuit board and optical fiber sub-assembly in the housing, the motherboard-interfacing region of the circuit is attached to the chassis. By virtue of the flexible region of the circuit board, as the chassis and circuit board are placed in the housing, the chip-receiving region of the circuit board is forced against the chassis. The chip-receiving portion is advantageously maintained in this position without the use of machine screws, etc.

The housing has an opening to allow a heat sink to be attached to the chip-receiving region of the circuit board to remove heat that is generated by the opto-electronic chip. The same fasteners (e.g., screws, etc.) that are used to attach the heat sink to the circuit board also advantageously attach the circuit board to the chassis, minimizing screw count in the circuit board.

DETAILED DESCRIPTION OF THE ILLUSTRATED EMBODIMENT

The terms listed below are given the following specific definitions for the purposes of this specification:

"Chip" refers to diced portions of a semiconductor wafer. The chip comprises a substrate, and circuitry that is embedded within and/or disposed on the substrate. The substrate typically comprises silicon, germanium or a group III–V compound semiconductor such as, without limitation, gallium arsenide and indium phosphide. The circuitry is capable of performing an electronics function or an opto-electronics function.

"Electronics function" refers to a function that is carried out by an electronics device or circuitry formed in/on the substrate of the chip, including, without limitation, functions carried out by drive circuitry, read-out circuitry, memory circuitry and processing circuitry.

"Opto-electronics function" refers to the conversion of an optical signal to an electrical signal (or generation of an electrical signal in response to exposure to an optical signal) or vice versa. Opto-electronic devices perform an opto-electronics function. Such devices include, without limitation, photodetectors, quantum well modulators and lasers. The term "opto-electronics" also refers to chips that are formed from group III–V compound semiconductors and that contain device(s) or circuitry for generating or processing an optical signal.

"Second level package" refers to a level of electronics packaging that provides one or more of the following attributes: (1) a path for electric current that powers one or more chips; (2) distributes signals onto and off of the chips; and (3) supports and protects one or more chips. Illustrative second level packages include, without limitation, a printed circuit board ("PCB") and a card.

"Chip package" comprises a second level package including one or more chips and a heat sink.

Figure 2:
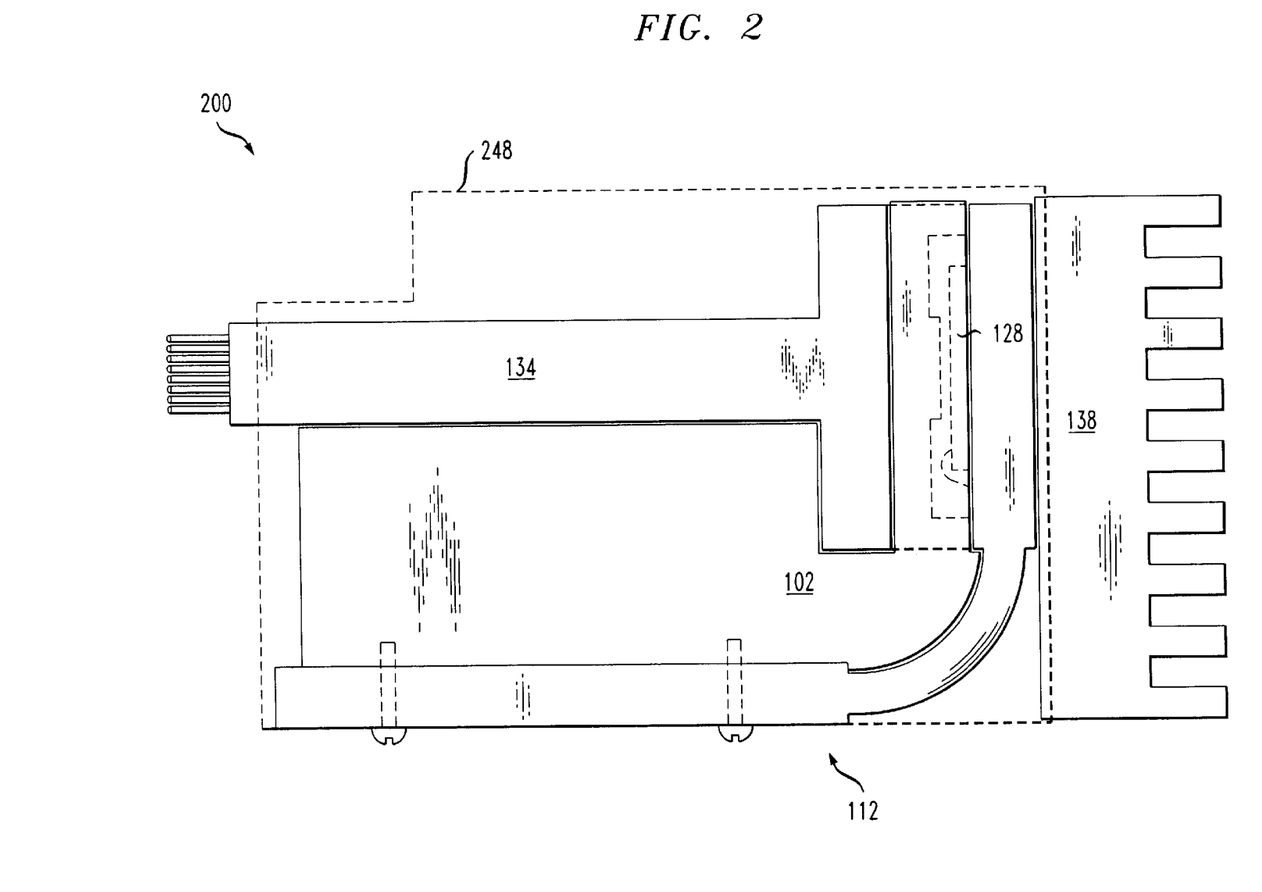
FIG. 2 depicts an opto-electronic chip package in accordance with the illustrative embodiment of the present invention.

FIG. 2 depicts a side view of opto-electronic chip package 200 having a reduced fastener count in accordance with the illustrative embodiment of the present invention. Opto-electronic chip package 200 includes all elements of the prior art package depicted in FIG. 1, including chassis 102, circuit board 112, opto-electronic chip 128, optical fiber sub-assembly 134 and heat sink 138.

One of the differences between the prior art opto-electronic chip package 100 and opto-electronic chip package 200 is that the number of fasteners (e.g., screws, etc.) that penetrate circuit board 112 =13 more particularly, that penetrate chip-receiving region 114—is advantageously reduced. This is accomplished through the use of an additional element that is not part of the conventional opto-electronic chip package of FIG. 1. That element is housing 248, which is shown in phantom in FIG. 2 for clarity.

In accordance with the principles of the invention, as chassis 102, circuit board 112 and optical fiber sub-assembly 134 are moved into housing 248, a physical adaptation of housing 248 forces chip-receiving portion 114 of circuit board 112 against first portion 104 of chassis 102. And the housing, in conjunction with the aforementioned physical adaptation, keeps the chip-recieving portion against the chassis without having to fasten them together.

Figure 3:
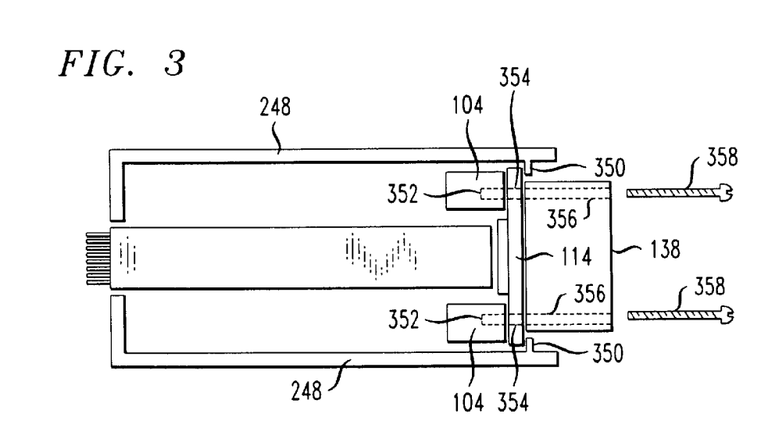
FIG. 3 depicts a top cross-sectional view of the opto-electronic chip package of FIG. 2.
Figure 4:
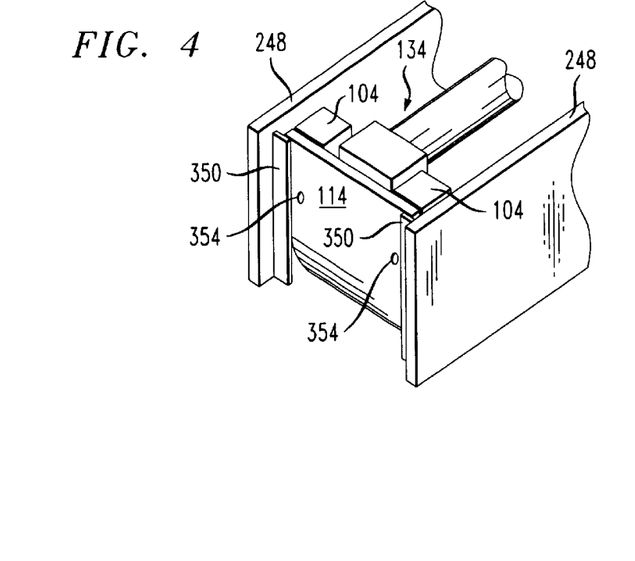
FIG. 4 depicts a partial, perspective view of the opto-electronic chip package of FIG. 2.

FIG. 3 depicts a top cross-sectional view and FIG. 4 depicts a partial, perspective view (FIG. 4 without heat sink 138) of opto-electronic chip package 200. In the variations depicted in FIGS. 3 and 4, the physical adaptation that is responsible for forcing chip-receiving region 114 of circuit board 112 against first portion 104 of chassis 102 is lip 350. It will be understood that other physical arrangements that provide the same function—that is, forcing chip-receiving region 114 against first portion 104 of chassis 102—can be substituted for lip 350 in accordance with the principles of the invention.

As described above, lip 350 forces and keeps chip-receiving region 114 against chassis 102 (in conjunction with the spring-loading or biasing effect created by flexible section 118 of circuit board 112). Consequently, heat sink 138 can be attached to first portion 104 of chassis 102 through chip-receiving region 114 without having to first fasten region 114 to the chassis. FIG. 3 depicts holes 352 in first portion 104 of chassis 102, holes 354 in chip-receiving portion 114 of circuit board 112 and holes 356 in heat sink 138, which receive a fastener 358 (e.g., machine screw, etc.) that is used to fixedly attach these elements to one another.

FIGS. 5A–5D depict the manner in which housing 248, and lip 350, force chip-receiving region 114 against first portion 104 of chassis 102. In these Figures, some of the elements (e.g., optical fiber sub-assembly 134, opto-electronic chip 128, etc.) have been omitted for clarity.

Figure 5A:
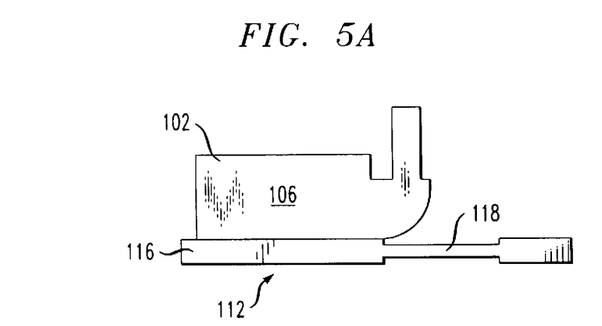
FIGS. 5A–5D depict stages in the manufacture of the opto-electronic chip package of FIG. 2.
Figure 5B:
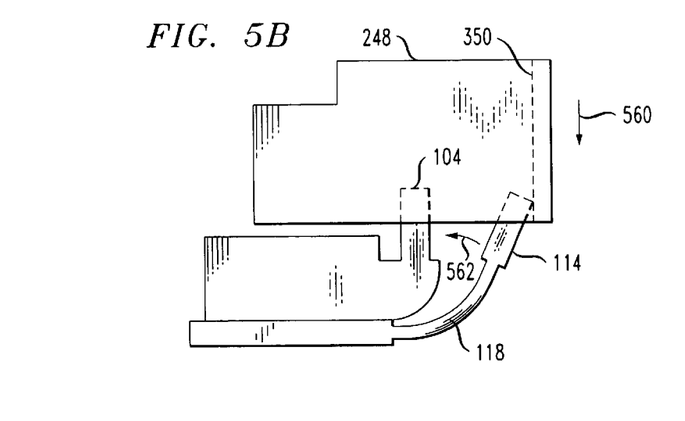

FIG. 5A depicts motherboard-interfacing region 116 of circuit board 112 attached (fasteners not depicted) to second portion 106 of chassis 102. The chassis is substantially linear; flexible region 118 has not been bent yet. FIG. 5B depicts chassis 102 and chip-receiving portion 114 of circuit board 112 being inserted into housing 248. As the housing is placed on top of chip-receiving portion 114 and moved downward along direction 560 (or the chassis and circuit board are moved upward), the chip-receiving portion engages lip 350 and is forced in the direction 562 toward first portion 104 of chassis 102.

Figure 5C:
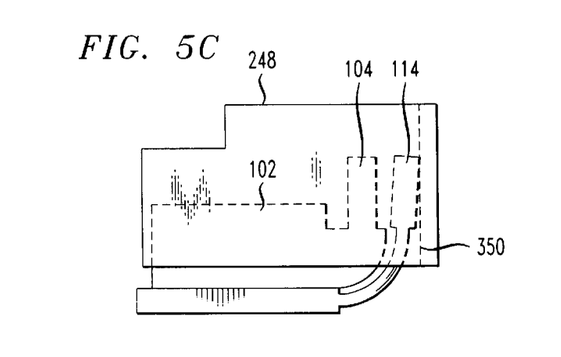
Figure 5D:
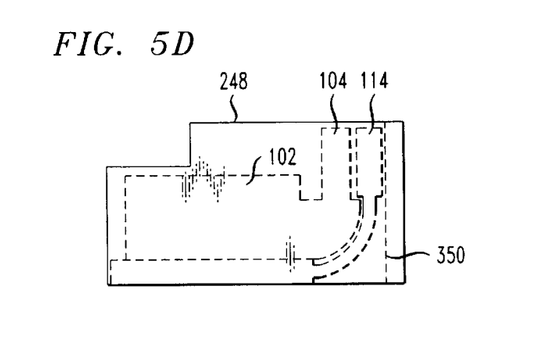

FIG. 5C depicts housing 248 nearly in place over chassis 102 and circuit board 112. In this illustration, chip-receiving region 114 has slid across most of lip 350 and has been forced close to first portion 104 of chassis 102. FIG. 5D shows housing 248 completely engaged, wherein lip 350 has forced chip-receiving region 114 to substantially abut first portion 104 of chassis 102. Chip-receiving region 114 remains in this position since it remains engaged to lip 350.

Figure 6:
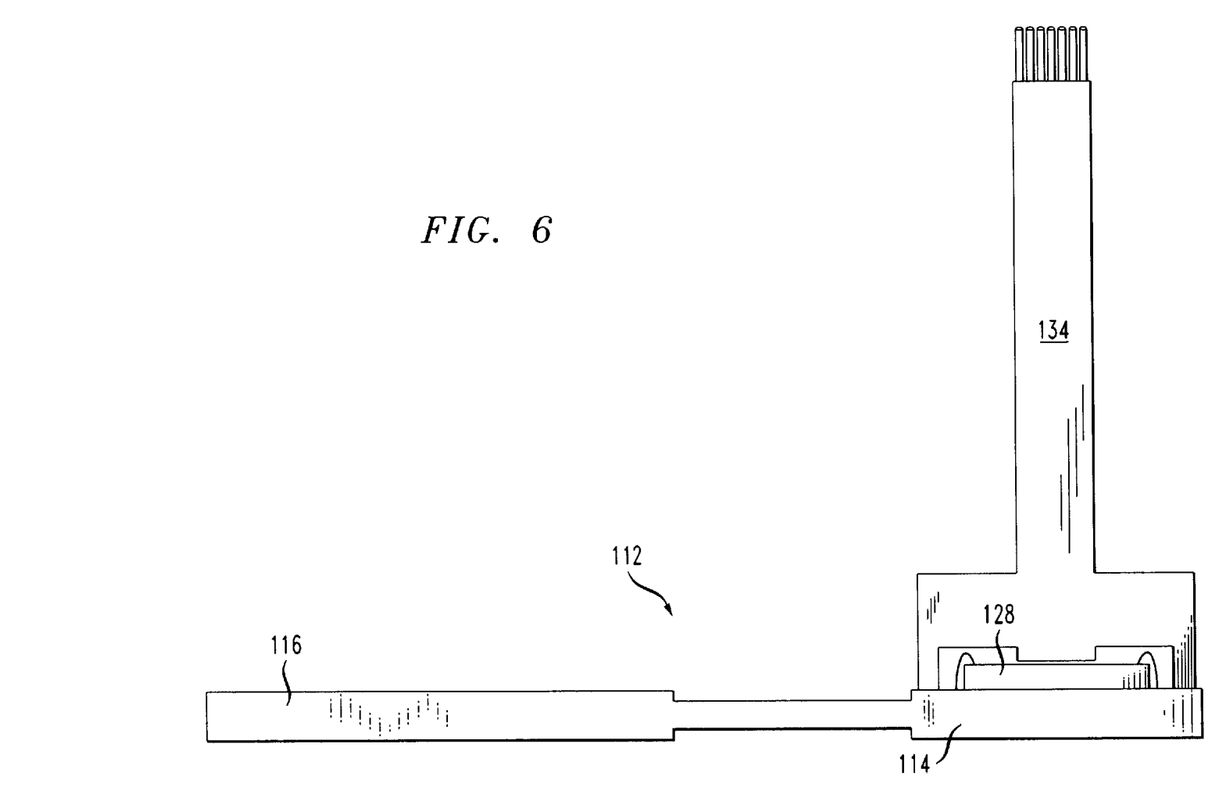
FIG. 6 depicts an operation wherein an opto-electronic chip and fiber optic sub-assembly are attached to a flexible circuit board.
Figure 7:
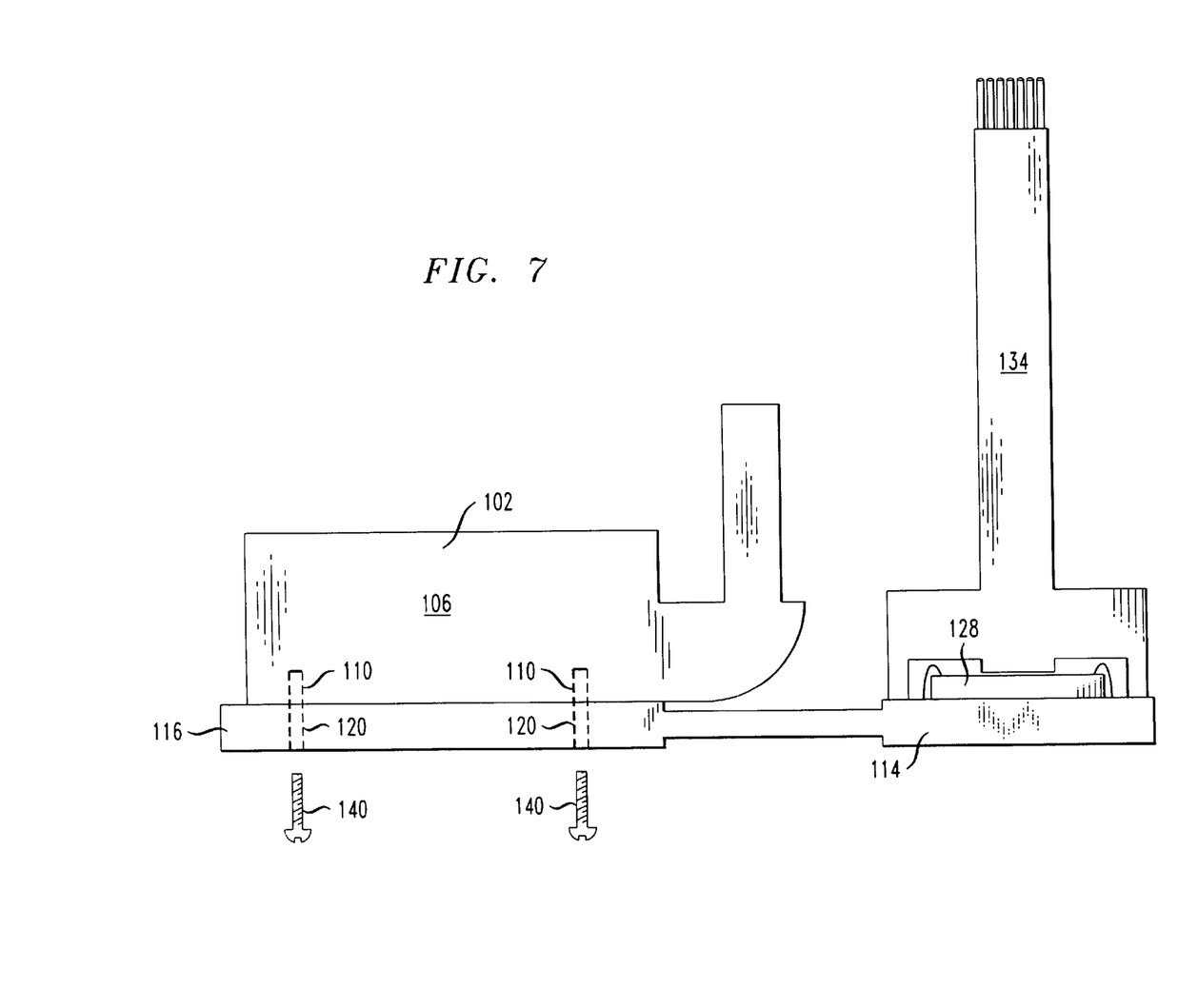
FIG. 7 depicts an operation wherein a motherboard-interfacing region of the flexible circuit board is attached to a second portion of a L-shaped chassis.

Regarding assembly, in an illustrative method, chip 128 and optical fiber sub-assembly 134 are attached to chip-receiving portion 114 of circuit board 112, as depicted in FIG. 6. Then, motherboard-interfacing region 116 is attached to second portion 106 of chassis 102, such as by using fasteners 140 (e.g., machine screws, etc.), as depicted in FIG. 7. In FIG. 7, fasteners 140 are received by threaded openings 120 in circuit board 112 and threaded openings 110 in chassis 102.

Figure 8:
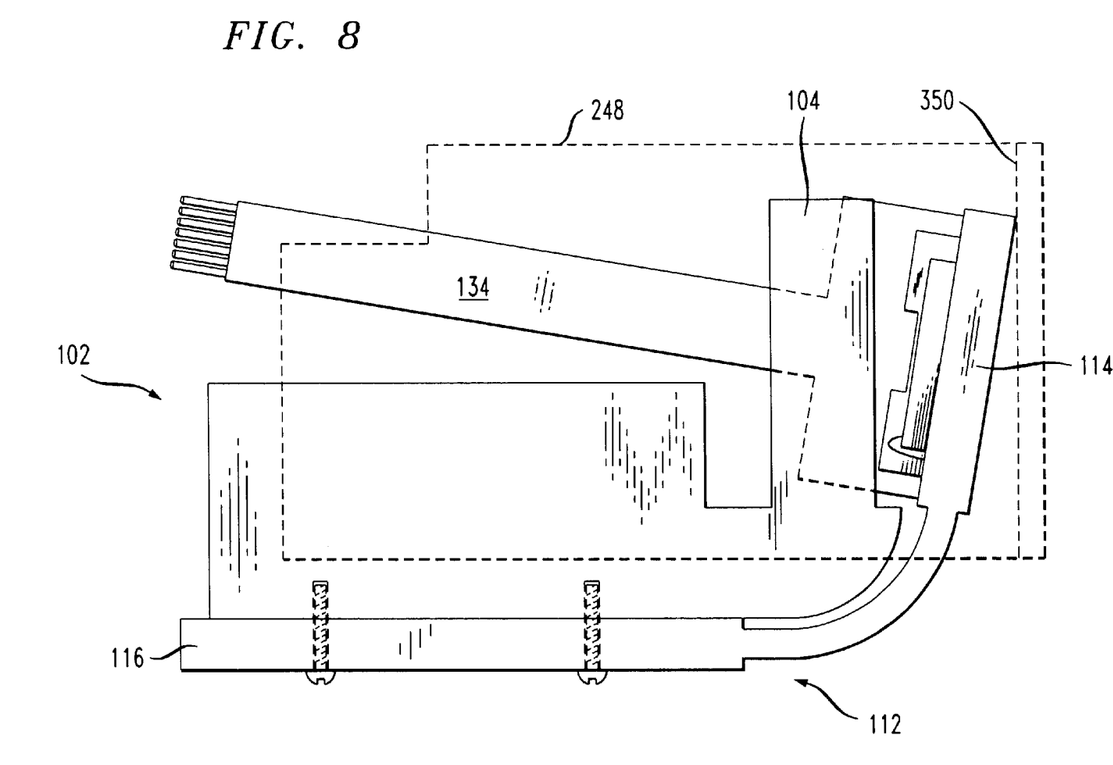
FIG. 8 depicts an operation wherein the chassis, circuit board and optical fiber sub-assembly are placed within a housing, forcing a chip-receiving region of the circuit board toward a first portion of the L-shaped chassis.

Once motherboard-interfacing region 116 of circuit board 112 is attached to chassis 102, the chassis, optical fiber sub-assembly 134 and circuit board 112 are inserted into housing 248 (shown in phantom for clarity), as depicted in FIG. 8. As previously described, chip-receiving region 114 of circuit board 112 engages lip 350 within the housing. Consequently, chip-receiving region 114 is forced toward first portion 104 of chassis 102 as the chip-receiving region slides over lip 350.

Figure 9:
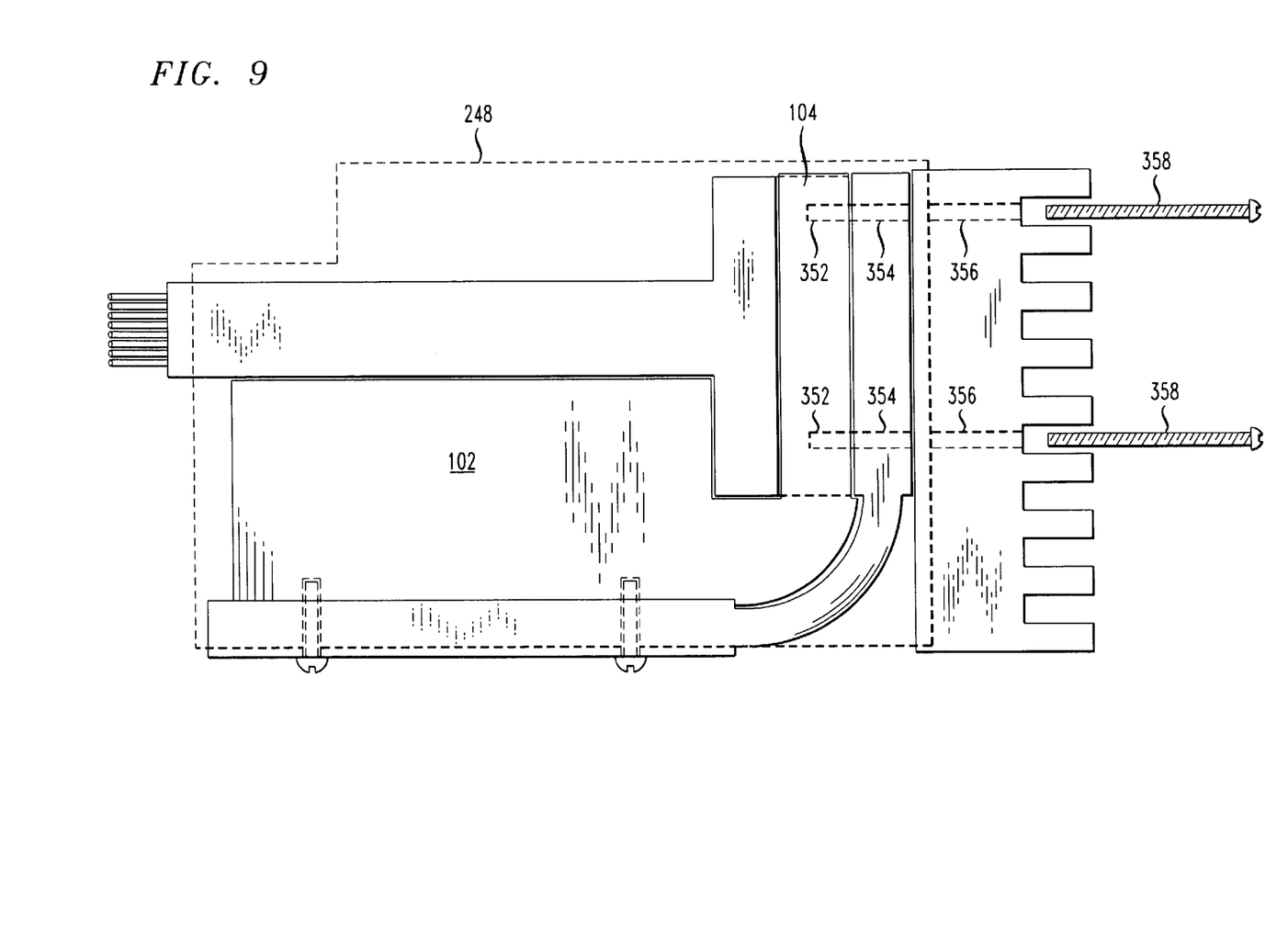
FIG. 9 depicts an operation wherein after the chassis, circuit board and optical fiber sub-assembly are in place within the housing, a heat sink is attached to the first portion of the chassis.

After housing 248 is in place, heat sink 138 is attached, as depicted in FIG. 9. In the illustrative embodiment, heat sink 138 is fastened to first portion 104 of chassis 102 using fasteners 358. Since chip-receiving region 114 is interposed between heat sink 138 and chassis 102, it is also becomes fastened during this operation. As previously described, this operation, wherein both heat sink 138 and circuit board 112 are fastened to chassis 102 by the same fasteners, advantageously reduces fastener count in chip-receiving region 114.

It is to be understood that the above-described embodiments are merely illustrative of the invention and that many variations may be devised by those skilled in the art without departing from the scope of the invention and from the principles disclosed herein. It is therefore intended that such variations be included within the scope of the following claims and their equivalents.

I claim:

1. In an opto-electronic package having:
   a rigid chassis, said chassis having a first portion and a second portion, wherein said first portion is orthogonal to said second portion; and
   a flexible circuit board, said circuit board having a chip-receiving region and a motherboard-interfacing region, wherein said motherboard-interfacing region is fixedly attached to said second portion of said rigid chassis; wherein the improvement comprises:
   a housing that receives said chassis and said circuit board, said housing having a physical adaptation that forces said chip-receiving portion of said circuit board against said first portion of said rigid chassis.

2. The opto-electronic package of claim 1 wherein said physical adaptation of said housing is a lip that engages said chip-receiving portion of said circuit board.

3. The opto-electronic package of claim 1, further comprising a heat sink, wherein:
   said heat sink abuts said chip-receiving receiving of said circuit board such that said chip-receiving region is interposed between said first portion of said chassis and said heat sink, and
   said heat sink is fixedly attached to said chassis thereby fixedly attaching said chip-receiving region of said circuit board against said first portion of said chassis.

4. The opto-electronic package of claim 3, wherein:
   at least two holes are defined in said heat sink;
   at least two holes are defined in said chip-receiving region of said circuit board that align with said two holes in said heat sink;
   said chassis has at least two receivers that are aligned with said two holes in said circuit board and said heat sink; and
   at least two fasteners that extend through said two holes in said heat sink and said two holes in said chip-receiving region of said circuit board and into said two receivers to fixedly attach said heat sink and said chip-receiving region of said circuit board to said chassis.

5. The opto-electronic package of claim 4 wherein said fasteners are machine screws.

6. The opto-electronic package of claim 3 further comprising an opto-electronic chip, wherein said opto-electronic chip is attached to said chip-receiving region of said circuit board.

7. The opto-electronic package of claim 6 wherein said opto-electronic chip comprises at least one surface emitting opto-electronic device.

8. The opto-electronic package of claim 7 wherein said surface emitting opto-electronic device is a vertical cavity surface emitting laser.

9. The opto-electronic package of claim 7 further comprising an optical fiber subassembly having at least one optical fiber, wherein:
   said optical fiber assembly is received by said chassis;
   said optical fiber is in optical communication with said surface normal opto-electronic device;
   an optical axis of said optical fiber is perpendicular to an emitting/receiving surface of said opto-electronic device; and
   an optical axis of said optical fiber is parallel to said motherboard-interfacing region of said circuit board.

10. An opto-electronic package comprising:
    a rigid chassis, said chassis having a first portion and a second portion, wherein said first portion is perpendicular to said second portion;
    a flexible circuit board, said circuit board having a chip-receiving region and a motherboard-interfacing region, wherein said motherboard-interfacing region is fixedly attached to said second portion of said rigid chassis;
    an opto-electronic chip attached to said circuit board at said chip-receiving region;
    a housing that receives said chassis and said circuit board, wherein said housing has a physical adaptation that forces said chip-receiving region of said circuit board against said first portion of said rigid chassis; and
    a heat sink that is fixedly attached to said circuit board and said chassis by at least two fasteners that attach both said heat sink and said circuit board to said chassis.

11. The opto-electronic package of claim 10 further comprising an optical fiber subassembly having a plurality of optical fibers, wherein:
    said optical fiber sub-assembly is received by said chassis;
    said optical fibers are aligned with a plurality of opto-electronic devices that are disposed on said opto-electronic chip;
    an optical axis of each said optical fibers is perpendicular to an emitting/receiving surface of said opto-electronic devices; and
    said optical axis is parallel to said motherboard-interfacing region of said circuit board.

12. The opto-electronic package of claim 11 wherein said opto-electronic devices are vertical cavity surface emitting lasers.

* * * * *